US012306377B2

(12) United States Patent
Nakano et al.

(10) Patent No.: US 12,306,377 B2
(45) Date of Patent: May 20, 2025

(54) METHOD FOR MANUFACTURING OPTICAL LENS PROVIDED WITH ANTI-REFLECTION FILM

(71) Applicant: Konica Minolta, Inc., Tokyo (JP)

(72) Inventors: Yoshihiro Nakano, Tondabaya (JP); Koji Takahara, Hirakata (JP)

(73) Assignee: Konica Minolta, Inc., Tokyo (JP)

( * ) Notice: Subject to any disclaimer, the term of this patent is extended or adjusted under 35 U.S.C. 154(b) by 548 days.

(21) Appl. No.: 17/779,127

(22) PCT Filed: Oct. 29, 2020

(86) PCT No.: PCT/JP2020/040635
§ 371 (c)(1),
(2) Date: May 24, 2022

(87) PCT Pub. No.: WO2021/131316
PCT Pub. Date: Jul. 1, 2021

(65) Prior Publication Data
US 2022/0413186 A1    Dec. 29, 2022

(30) Foreign Application Priority Data
Dec. 25, 2019   (JP) .................... 2019-234863

(51) Int. Cl.
G02B 1/115    (2015.01)
C23C 14/06    (2006.01)
C23C 14/10    (2006.01)

(52) U.S. Cl.
CPC .......... *G02B 1/115* (2013.01); *C23C 14/0694* (2013.01); *C23C 14/10* (2013.01)

(58) Field of Classification Search
CPC ..... G02B 1/115; C23C 14/0694; C23C 14/10; C23C 14/221; C23C 14/30; B29D 11/00009; B29D 11/00865; G02C 7/02
USPC ........................................ 359/359
See application file for complete search history.

(56) References Cited

FOREIGN PATENT DOCUMENTS

| JP | H03-255401 A | 11/1991 |
|----|--------------|---------|
| JP | H06-240445 A | 8/1994  |
| JP | H09314716 A  | 12/1997 |
| JP | 10029896 A * | 2/1998  |

(Continued)

OTHER PUBLICATIONS

International Search Report issued in corresponding International Application No. PCT/JP2020/040635 mailed Dec. 8, 2020 (6 pages).

(Continued)

*Primary Examiner* — Charles S Chang
(74) *Attorney, Agent, or Firm* — Osha Bergman Watanabe & Burton LLP

(57) ABSTRACT

A method for manufacturing an optical lens using an ion-assisted deposition apparatus that comprises an ion source includes: forming, on a lens substrate made of a material containing 40 mass % or more of fluoride, a first lower layer of an anti-reflection film of the optical lens, wherein the first lower layer is a fluoride layer; forming, on the first lower layer, a second lower layer of the anti-reflection film; forming on the second lower layer, one or more intermediate layers of the antireflection film; forming, on the one or more intermediate layers, an uppermost layer of the anti-reflection film; and irradiating, using the ion source, the lens substrate with ions.

20 Claims, 7 Drawing Sheets

(56) References Cited

FOREIGN PATENT DOCUMENTS

| | | |
|---|---|---|
| JP | H10-29896 A | 2/1998 |
| JP | 2006-104522 A | 4/2006 |
| WO | 2017/204127 A1 | 11/2017 |

OTHER PUBLICATIONS

Written Opinion issued in corresponding International Application No. PCT/JP2020/040635 mailed Dec. 8, 2020 (10 pages).
Office Action issued in counterpart Chinese Patent Application No. CN 202080089111.8 dated May 12, 2023 (19 pages).
Office Action issued in corresponding Japanese Patent Application No. 2021-566872, mailed Mar. 18, 2025, with translation (10 pages).

* cited by examiner

METHOD FOR MANUFACTURING OPTICAL LENS PROVIDED WITH ANTI-REFLECTION FILM

TECHNICAL FIELD

The present disclosure relates to a method for manufacturing an optical lens provided with an anti-reflection film.

BACKGROUND

JP 10-29896 A (Patent Literature 1) discloses a multilayer optical thin film formed on a fluoride-based crystalline substrate. Specifically, in Patent Literature 1, a first layer of the multilayer optical thin film counted from the fluoride-based crystalline substrate side is a layer formed by a fluoride-based substance.

CITATION LIST

Patent Literature

Patent Literature 1: JP 10-29896 A

SUMMARY

As a lens substrate on which the anti-reflection film is formed, a substrate having a large content of fluoride may be employed. When the content of the fluoride contained in the substrate increases, the anti-reflection film may be peeled off from the lens substrate. Further, the light absorption rate of the anti-reflection film may increase. One or more embodiments of the invention provide a method for manufacturing an optical lens provided with an anti-reflection film, which prevents the anti-reflection film from peeling off from a lens substrate having a large amount of fluoride and has a reduced light absorption rate.

A method for manufacturing an optical lens provided with an anti-reflection film according to the present disclosure uses an ion-assisted deposition apparatus including an ion source that irradiates a lens substrate with ions. The method for manufacturing the optical lens provided with the anti-reflection film according to the present disclosure includes forming a first lower layer of the anti-reflection film on the lens substrate formed of a material containing 40 mass % or more of fluoride, and forming a second lower layer of the anti-reflection film on the first lower layer. The method for manufacturing the optical lens provided with the anti-reflection film according to the present disclosure includes forming at least one layer (i.e., one or more intermediate layers) of the anti-reflection film on the second lower layer, and forming an uppermost layer of the anti-reflection film on the at least one layer. The first lower layer is a fluoride layer. First energy and a first amount per unit time of the ions reaching the first lower layer and at least a lower half of the second lower layer while forming the first lower layer and at least the lower half of the second lower layer are respectively smaller than second energy and a second amount per unit time of the ions reaching the at least one layer while forming the at least one layer. The lower half of the second lower layer is a portion of the second lower layer on a side of the first lower layer with respect to a center of the second lower layer in a thickness direction of the second lower layer.

For example, a first ion acceleration voltage and a first ion current of the ion source while forming the first lower layer and at least the lower half of the second lower layer are respectively smaller than a second ion acceleration voltage and a second ion current of the ion source while forming the at least one layer of the anti-reflection film.

For example, the first ion acceleration voltage is 300 V or less. The first ion current is 300 mA or less.

For example, the second ion acceleration voltage is 500 V or more. The second ion current is 500 mA or more.

For example, the ion-assisted deposition apparatus further includes a movable shutter. While forming the first lower layer and at least the lower half of the second lower layer, the movable shutter is inserted into (i.e., positioned in) a path of the ions from the ion source to the lens substrate. While forming the at least one layer, the movable shutter is retracted from (i.e., not positioned in) the path of the ions.

For example, the first lower layer is an $MgF_2$ layer.

For example, a ¼ wavelength optical thickness of the first lower layer at a design reference wavelength $\lambda_0$ of 550 nm is 0.1 or more. The ¼ wavelength optical thickness of the first lower layer at the design reference wavelength $\lambda_0$ is given by dividing an optical thickness of the first lower layer by one fourth ($\lambda_0/4$) of the design reference wavelength. The optical thickness of the first lower layer is given by a product of a refractive index of the first lower layer at the design reference wavelength $\lambda_0$ and a physical thickness (nm) of the first lower layer.

For example, the uppermost layer is a fluoride layer. Third energy and a third amount per unit time of the ions reaching the uppermost layer while forming the uppermost layer are smaller than the second energy and the second amount per unit time, respectively.

For example, the uppermost layer is an $MgF_2$ layer.

For example, the ions reaching an entirety of the second lower layer while forming the entirety of the second lower layer have the first energy and the first amount per unit time.

For example, fourth energy and a fourth amount per unit time of the ions reaching a portion farthest from the lens substrate in the second lower layer while forming the portion farthest from the lens substrate in the second lower layer are larger than the first energy and the first amount per unit time, respectively.

For example, the fourth energy and the fourth amount per unit time are equal to the second energy and the second amount per unit time, respectively.

According to a method for manufacturing an optical lens provided with an anti-reflection film according to the present disclosure, the anti-reflection film can be prevented from peeling off from a lens substrate, and a light absorption rate of the anti-reflection film can be reduced.

DETAILED DESCRIPTION

Figure 1:
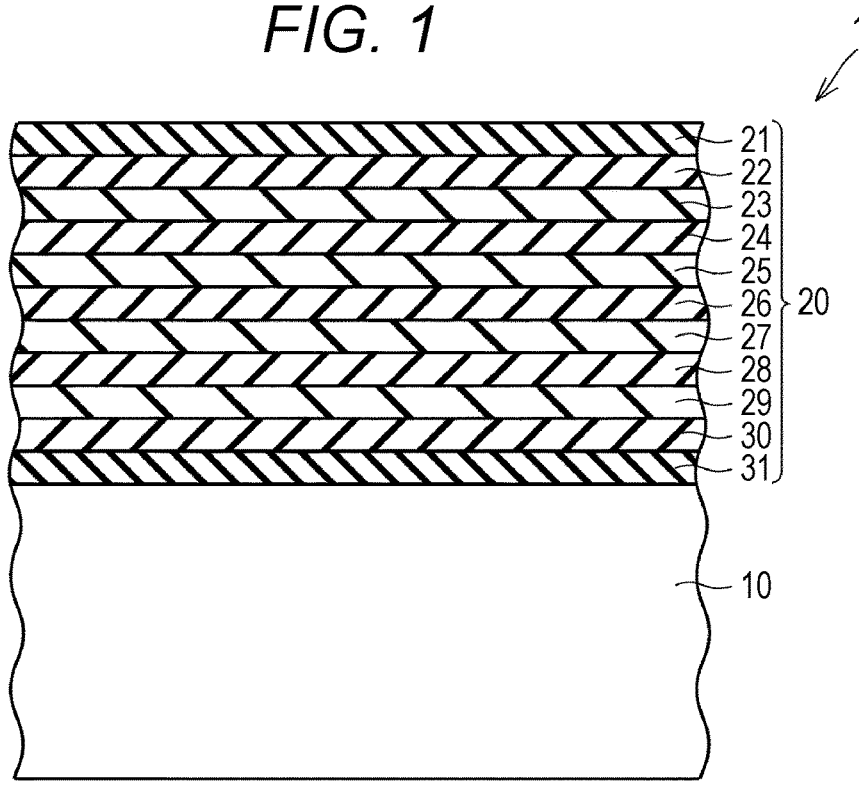
FIG. 1 is a partially enlarged cross-sectional view of an optical lens provided with an anti-reflection film according to an example (Example 1, Example 2, and Example 5) of one or more embodiments.

An optical lens provided with an anti-reflection film, a projection lens, and a projection lens optical system according to one or more embodiments will be described with reference to the drawings.

A method for manufacturing an optical lens provided with an anti-reflection film according to one or more embodiments uses an ion-assisted deposition apparatus including an ion source that irradiates a lens substrate with ions. The method for manufacturing the optical lens provided with the anti-reflection film according to one or more embodiments includes forming a first lower layer of the anti-reflection film on the lens substrate formed of a material containing 40 mass % or more of fluoride, and forming a second lower layer of the anti-reflection film on the first lower layer. The method for manufacturing the optical lens provided with the anti-reflection film according to one or more embodiments includes forming at least one layer of the anti-reflection film on the second lower layer, and forming an uppermost layer of the anti-reflection film on the at least one layer. The first lower layer is a fluoride layer. First energy and a first amount per unit time of the ions reaching the first lower layer and at least a lower half of the second lower layer while forming the first lower layer and at least the lower half of the second lower layer are respectively smaller than second energy and a second amount per unit time of the ions reaching the at least one layer while forming the at least one layer. The lower half of the second lower layer is a portion of the second lower layer on a side of the first lower layer with respect to a center of the second lower layer in a thickness direction of the second lower layer.

The first lower layer of the anti-reflection film in contact with the lens substrate formed of a material containing 40 mass % or more of fluoride is a fluoride layer. Thus, the anti-reflection film can be prevented from peeling off from the lens substrate. Further, the first energy and the first amount per unit time of the ions reaching the first lower layer that is the fluoride layer while forming the first lower layer and at least the lower half of the second lower layer are respectively smaller than the second energy and the second amount per unit time of the ions reaching the at least one layer while forming the at least one layer of the anti-reflection film. Thus, desorption of fluorine from the first lower layer is suppressed. The light absorption rate of the anti-reflection film is reduced.

For example, a first ion acceleration voltage and a first ion current of the ion source while forming the first lower layer and at least the lower half of the second lower layer are respectively smaller than a second ion acceleration voltage and a second ion current of the ion source while forming the at least one layer of the anti-reflection film. Thus, the desorption of fluorine from the first lower layer is suppressed. The light absorption rate of the anti-reflection film is reduced.

For example, the first ion acceleration voltage is 300 V or less. The first ion current is 300 mA or less. Thus, the desorption of fluorine from the first lower layer is suppressed. The light absorption rate of the anti-reflection film is reduced.

For example, the second ion acceleration voltage is 500 V or more. The second ion current is 500 mA or more. Thus, film density and flatness of at least one layer of the anti-reflection film stacked between the second lower layer and the uppermost layer of the anti-reflection film are improved. Occurrence of color unevenness in the anti-reflection film is suppressed, and reproducibility of reflection characteristics of the anti-reflection film is improved.

For example, the ion-assisted deposition apparatus further includes a movable shutter. While forming the first lower layer and at least the lower half of the second lower layer, the movable shutter is inserted into a path of the ions from the ion source to the lens substrate. While forming the at least one layer, the movable shutter is retracted from the path of the ions. Thus, the desorption of fluorine from the first lower layer is suppressed. The light absorption rate of the anti-reflection film is reduced.

For example, the first lower layer is an $MgF_2$ layer. Thus, the anti-reflection film can be prevented from peeling off from the lens substrate.

For example, a ¼ wavelength optical thickness (QWOT) of the first lower layer at a design reference wavelength $\lambda_0$ of 550 nm is 0.1 or more. The ¼ wavelength optical thickness (QWOT) of the first lower layer at the design reference wavelength $\lambda_0$ is given by dividing an optical thickness of the first lower layer by one fourth ($\lambda_0/4$) of the design reference wavelength. The optical thickness of the first lower layer is given by a product of a refractive index of the first lower layer at the design reference wavelength $\lambda_0$ and a physical thickness (nm) of the first lower layer. Thus, the first lower layer has a sufficient thickness to prevent the anti-reflection film from peeling off from the lens substrate. The anti-reflection film can be prevented from peeling off from the lens substrate.

For example, the uppermost layer is a fluoride layer. Third energy and a third amount per unit time of the ions reaching the uppermost layer while forming the uppermost layer are smaller than the second energy and the second amount per unit time, respectively. Thus, desorption of fluorine from the uppermost layer is suppressed. The light absorption rate of the anti-reflection film is reduced.

For example, the uppermost layer is an $MgF_2$ layer. $MgF_2$ has a high light transmittance and a low refractive index in a wavelength region of 430 nm or more and 670 nm or less. Thus, by using the $MgF_2$ layer as the uppermost layer of the anti-reflection film closest to an air side in the anti-reflection film, the light absorption rate and reflectance of the anti-reflection film can be reduced in a wavelength range of 430 nm or more and 670 nm or less.

For example, the ions reaching an entirety of the second lower layer while forming the entirety of the second lower layer have the first energy and the first amount per unit time. Thus, the desorption of fluorine from the first lower layer is further suppressed. The light absorption rate of the anti-reflection film is reduced.

For example, fourth energy and a fourth amount per unit time of the ions reaching a portion farthest from the lens substrate in the second lower layer while forming the portion farthest from the lens substrate in the second lower layer are larger than the first energy and the first amount per unit time, respectively. Thus, the film density and flatness of the second lower layer of the anti-reflection film are improved. The occurrence of color unevenness in the anti-reflection film is suppressed, and the reproducibility of reflection characteristics of the anti-reflection film is improved.

For example, the fourth energy and the fourth amount per unit time are equal to the second energy and the second amount per unit time, respectively. Thus, the film density and flatness of the second lower layer of the anti-reflection film are improved. The occurrence of color unevenness in the anti-reflection film is suppressed, and the reproducibility of reflection characteristics of the anti-reflection film is improved.

Specific Configuration of Optical Lens 1 Provided with Anti-Reflection Film of One or More Embodiments An optical lens 1 provided with an anti-reflection film according to an example of one or more embodiments will be described with reference to FIG. 1. The optical lens 1 provided with the anti-reflection film includes a lens substrate 10 and an anti-reflection film 20 formed on the lens substrate 10.

The lens substrate 10 is formed of a material containing 40 mass % or more of fluoride. The lens substrate 10 is formed of, for example, a glass material such as FCD100 (manufactured by HOYA Corporation) or FCD1 (manufactured by HOYA Corporation). The chemical components of FCD100 (manufactured by HOYA Corporation) and FCD1 (manufactured by HOYA Corporation) are illustrated in Table 1.

TABLE 1

| Chemical component | FCD100 | FCD1 |
|---|---|---|
| $P_2O_5$ | 1 to 10 | 20 to 30 |
| BaO | 1 to 10 | 10 to 20 |
| $Al_2O_3$ | — | 1 to 10 |
| $AlF_3$ | 30 to 40 | 10 to 20 |
| $MgF_2$ | 1 to 10 | 1 to 10 |
| $CaF_2$ | 20 to 30 | 10 to 20 |
| $SrF_2$ | 20 to 30 | 20 to 30 |
| $BaF_2$ | 1 to 10 | — |
| $YF_3$ | 1 to 10 | 1 to 10 |
| $BaCl_2$ | 0 to 1 | — |

(Unit: mass %)

The anti-reflection film 20 includes a first lower layer, a second lower layer, at least one layer, and an uppermost layer. The first lower layer is in contact with the lens substrate 10. The first lower layer is, for example, a fluoride layer such as an $MgF_2$ layer. The second lower layer is stacked on the first lower layer in a thickness direction of the anti-reflection film 20. The first lower layer is located between the lens substrate 10 and the second lower layer in the thickness direction of the anti-reflection film 20.

The at least one layer of the anti-reflection film 20 is stacked on the second lower layer. The at least one layer of the anti-reflection film 20 is located between the second lower layer and the uppermost layer of the anti-reflection film 20 in the thickness direction of the anti-reflection film 20. The at least one layer of the anti-reflection film 20 is in contact with the second lower layer and the uppermost layer. The at least one layer of the anti-reflection film 20 may be a plurality of layers. In a case where the at least one layer of the anti-reflection film 20 is a plurality of layers, the at least one layer of the anti-reflection film 20 means all of the plurality of layers between the second lower layer and the uppermost layer. The at least one layer of the anti-reflection film 20 may be at least seven layers, and the anti-reflection film 20 may include at least 10 layers.

The uppermost layer is stacked on the at least one layer of the anti-reflection film 20. The uppermost layer is a layer that is closest to the air side of the anti-reflection film 20. The uppermost layer is a layer of the anti-reflection film 20 that is most distal from the lens substrate 10. The uppermost layer is, for example, a fluoride layer such as an $MgF_2$ layer.

Referring to FIG. 1, a first layer 21 of the anti-reflection film 20 counted from the air side is the uppermost layer of the anti-reflection film 20. The first layer 21 is a fluoride layer. The first layer 21 is, for example, an $MgF_2$ layer.

Each of a second layer 22, a fourth layer 24, a sixth layer 26, an eighth layer 28, and a tenth layer 30 of the anti-reflection film 20 counted from the air side is a high refractive index layer having a refractive index of 2.0 or more and 2.3 or less with respect to a design reference wavelength $\lambda_0$=550 nm. For example, each of the second layer 22, the fourth layer 24, the sixth layer 26, the eighth layer 28, and the tenth layer 30 is a $Ta_2O_5$ layer (refractive index 2.16), a $ZrO_2$ layer (refractive index 2.05), a layer formed of a mixture of $ZrTiO_4$ and $ZrO_2$ (refractive index 2.08), a $LaTiO_3$ layer (refractive index 2.1), a layer formed of a mixture of $ZrO_2$ and $TiO_2$ (refractive index 2.15), a layer formed of a mixture of $Ta_2O_5$ and $ZrO_2$ (refractive index 2.22), a layer formed of a mixture of $Ta_2O_5$ and $TiO_2$ (refractive index 2.24), a $Nb_2O_5$ layer (refractive index 2.3), or a $TiO_2$ layer (refractive index 2.3). In the example of one or more embodiments (see FIG. 1), the tenth layer 30 corresponds to the second lower layer of the anti-reflection film 20.

Each of a third layer 23, a fifth layer 25, a seventh layer 27, and a ninth layer 29 of the anti-reflection film 20 counted from the air side is a low refractive index layer having a refractive index of 1.44 or more and 1.50 or less with respect to a design reference wavelength $\lambda_0$=550 nm. For example, each of the third layer 23, the fifth layer 25, the seventh layer 27, and the ninth layer 29 is a $SiO_2$ layer. In the example of one or more embodiments (see FIG. 1), the second layer 22 to the ninth layer 29 correspond to the at least one layer of the anti-reflection film 20.

In the example of one or more embodiments (see FIG. 1), an eleventh layer 31 of the anti-reflection film 20 is in contact with the lens substrate when counted from the air side. The eleventh layer 31 is a lowermost layer of the anti-reflection film 20. The eleventh layer 31 corresponds to the first lower layer of the anti-reflection film 20. The eleventh layer 31 is a fluoride layer. The eleventh layer 31 is, for example, an $MgF_2$ layer. A ¼ wavelength optical thickness (QWOT) of the eleventh layer 31 at a design reference wavelength $\lambda_0$ of 550 nm is 0.1 or more. The ¼ wavelength optical thickness (QWOT) of the eleventh layer 31 at the design reference wavelength $\lambda_0$ is given by dividing an optical thickness of the eleventh layer 31 by $\lambda_0/4$. The optical thickness of the eleventh layer 31 is given by a product of a refractive index of the eleventh layer 31 at the design reference wavelength $\lambda_0$ and a physical thickness (nm) of the eleventh layer 31.

A maximum reflectance of the anti-reflection film 20 in the wavelength range of 430 nm or more and 670 nm or less may be 0.2% or less. Specifically, the maximum reflectance of the anti-reflection film 20 in the wavelength range of 430 nm or more and 670 nm or less may be 0.1% or less.

Ion-Assisted Deposition Apparatus 40 of One or More Embodiments

An ion-assisted deposition apparatus 40 used in the method for manufacturing the optical lens 1 provided with an anti-reflection film according to one or more embodiments will be described with reference to FIGS. 2 and 3.

Figure 2:
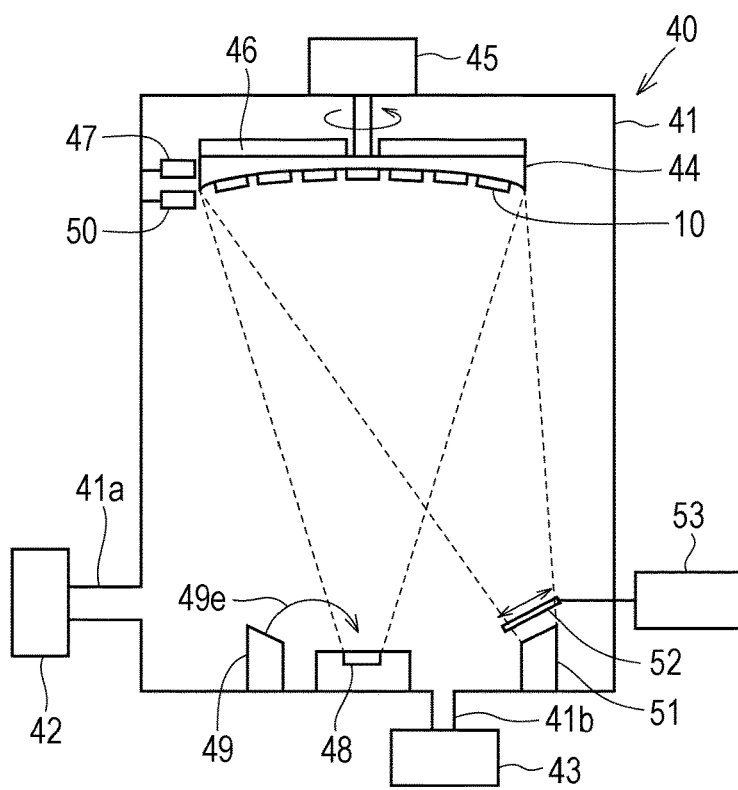
FIG. 2 is a schematic view of an ion-assisted deposition apparatus used in a method for manufacturing the optical lens provided with the anti-reflection film according to one or more embodiments.

Referring to FIG. 2, the ion-assisted deposition apparatus 40 includes a chamber 41, an exhaust pump 42, a gas supply unit 43, a substrate holder 44, a first motor 45, a heater 46, a temperature sensor 47, a vapor deposition source 48, an electron gun 49, a film thickness meter 50, an ion source 51, a movable shutter 52, a second motor 53, and a controller 55.

The chamber 41 is provided with an exhaust port 41*a* and a gas injection port 41*b*. The exhaust port 41*a* is connected to the exhaust pump 42. The exhaust pump 42 exhausts the gas in the chamber 41. When the exhaust pump 42 exhausts the gas in the chamber 41, the atmosphere in the chamber 41 becomes high vacuum. The gas injection port 41*b* is connected to the gas supply unit 43. The gas supply unit 43 supplies a gas such as oxygen ($O_2$) gas or argon (Ar) gas into the chamber 41.

The substrate holder 44 is disposed in the chamber 41. The substrate holder 44 is supported by the chamber 41 so as to be rotatable with respect to the chamber 41. The substrate holder 44 holds a plurality of lens substrates 10. The heater 46 heats the substrate holder 44. The temperature of the substrate holder 44 is measured using the temperature sensor 47. The temperature of the substrate holder 44 can be adjusted according to a deposition material, a material of the lens substrate 10, and the like. The first motor 45 rotates the substrate holder 44 with respect to the chamber 41. The anti-reflection film 20 is formed on the plurality of lens substrates 10 while the substrate holder 44 is rotated with respect to the chamber 41. Thus, the plurality of anti-reflection films 20 formed on the plurality of lens substrates 10, respectively, can be uniformly formed.

The vapor deposition source 48 includes a plurality of crucibles (not illustrated). A plurality of deposition materials corresponding to materials of a plurality of layers (for example, the first layer to the eleventh layer illustrated in FIG. 1) constituting the anti-reflection film 20 is charged in a plurality of crucibles, respectively. The electron gun 49 emits electrons 49*e* to the deposition material charged in the vapor deposition source 48. The vapor deposition material collided with the electrons 49*e* is heated and evaporated. The evaporated deposition material is deposited on a surface to be deposited such as the plurality of lens substrates 10. In this manner, a plurality of layers constituting the anti-reflection film 20 is formed. The film thickness meter 50 measures thicknesses of a plurality of layers constituting the anti-reflection film 20. The film thickness meter 50 is, for example, a quartz crystal film thickness meter.

The ion source 51 irradiates the lens substrates 10 with ions. The ion source 51 is, for example, an ion gun. By depositing the deposition material on the surface to be deposited while irradiating the surface to be deposited with ions, the deposition material can be ion-assisted deposited on the surface to be deposited such as the lens substrates 10. An ion-assisted deposition method enables formation of a layer with improved film density, flatness, and adhesion.

The movable shutter 52 is movable with respect to the chamber 41 and the ion source 51. The movable shutter 52 can block ions from reaching a surface to be deposited such as the lens substrates 10. The second motor 53 moves the movable shutter 52. When the movable shutter 52 is inserted into a path of the ions from the ion source 51 to the lens substrates 10, the movable shutter 52 blocks the ions from reaching the surface to be deposited such as the lens substrates 10 from the ion source 51. At this time, normal vacuum deposition without ion-assisted irradiation is performed. When the movable shutter 52 is retracted from the path of the ions from the ion source 51 to the lens substrates 10, the ions reach the surface to be deposited such as the lens substrates 10. At this time, ion-assisted deposition is performed.

Figure 3:
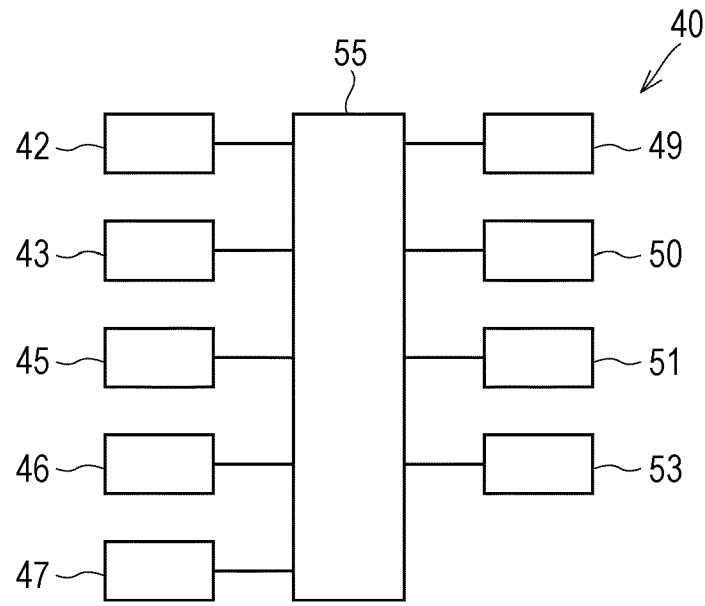
FIG. 3 is a block diagram of the ion-assisted deposition apparatus used in the method for manufacturing the optical lens provided with the anti-reflection film according to one or more embodiments.

Referring to FIG. 3, the controller 55 is, for example, a computer or a semiconductor processor. The controller 55 is communicably connected to the exhaust pump 42, the gas supply unit 43, the first motor 45, the heater 46, the temperature sensor 47, the electron gun 49, the film thickness meter 50, the ion source 51, and the second motor 53. The controller 55 controls the exhaust pump 42 and the gas supply unit 43 to adjust the atmosphere in the chamber 41. The controller 55 causes the first motor 45 to rotate the substrate holder 44. The controller 55 controls the heater 46 on the basis of the temperature of the substrate holder 44 measured using the temperature sensor 47. The controller 55 controls the electron gun 49 on the basis of the thickness of the anti-reflection film 20 measured by the film thickness meter 50.

The controller 55 controls the ion source 51 according to the type of vapor deposition material, the thickness of the anti-reflection film 20 measured by the film thickness meter 50, and the like. Specifically, the controller 55 controls the ion acceleration voltage and the ion current of the ion source 51. As the ion acceleration voltage of the ion source 51 increases, the energy of ions reaching the surface to be deposited increases. As the ion current of the ion source 51 increases, the amount of ions per unit time reaching the surface to be deposited increases.

The ion acceleration voltage is, for example, 0 V or more and 1 kV or less. The ion current is, for example, 0 mA or more and 1000 mA or less. By setting the ion acceleration voltage to 0 V and setting the ion current to 0 mA, normal vacuum deposition without ion assist irradiation may be performed. Normal vacuum deposition without ion-assisted irradiation may be performed by blocking the path of the ions from the ion source 51 to the lens substrate 10 using the movable shutter 52. When ion-assisted deposition is performed, the ion acceleration voltage is, for example, 100 V or more, and the ion current is, for example, 100 mA or more. Specifically, when ion-assisted deposition is performed, the ion acceleration voltage may be 200 V or more and the ion current may be 200 mA or more. When ion-assisted deposition is performed, the movable shutter 52 is retracted from the path of the ions from the ion source 51 to the lens substrate 10.

Method for Manufacturing Optical Lens 1 Provided with Anti-Reflection Film of One or More Embodiments A method for manufacturing the optical lens 1 provided with the anti-reflection film according to one or more embodiments will be described with reference to FIG. 4. The method for manufacturing the optical lens 1 provided with the anti-reflection film according to one or more embodiments uses the ion-assisted deposition apparatus 40 (see FIGS. 2 and 3). The ion-assisted deposition apparatus 40 includes the ion source 51 that irradiates the lens substrate 10 with ions.

Figure 4:
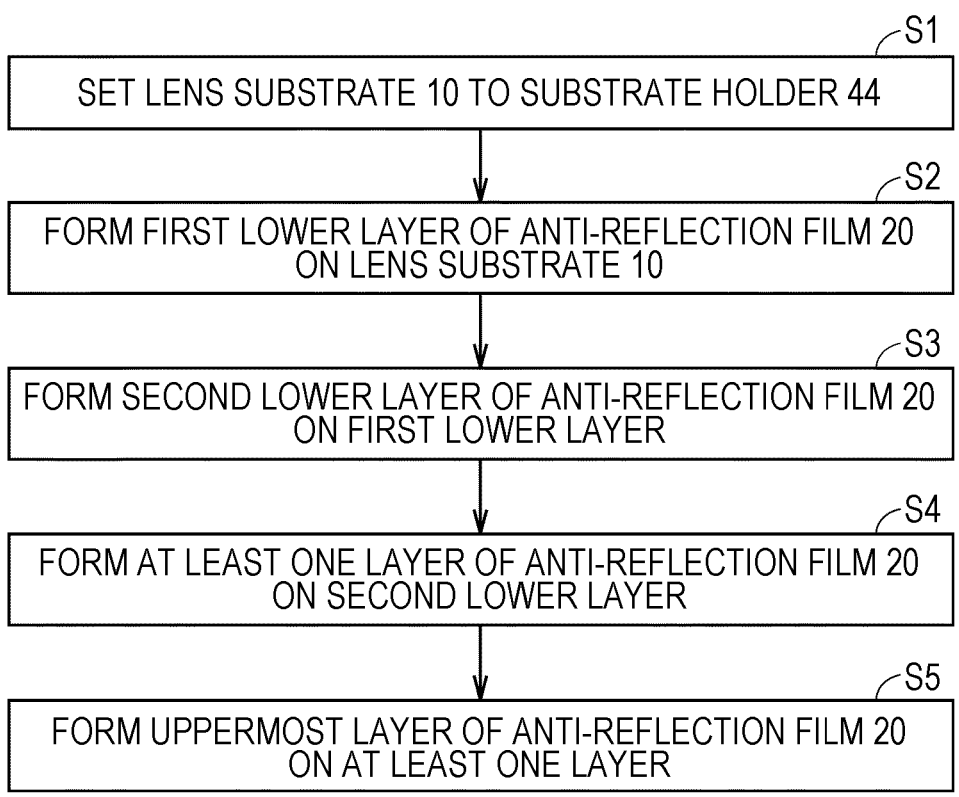
FIG. 4 is a flowchart of the method for manufacturing the optical lens provided with the anti-reflection film according to one or more embodiments.

As illustrated in FIG. 4, the method for manufacturing the optical lens 1 provided with the anti-reflection film according to one or more embodiments includes setting the lens substrate 10 in the substrate holder 44 disposed in the chamber 41 (S1). The lens substrate 10 is formed of a material containing 40 mass % or more of fluoride. The lens substrate 10 is formed of, for example, a glass material such as FCD100 (manufactured by HOYA Corporation) or FCD1 (manufactured by HOYA Corporation).

As illustrated in FIG. 4, the method for manufacturing the optical lens 1 provided with the anti-reflection film according to one or more embodiments includes forming a first lower layer of the anti-reflection film 20 on the lens substrate 10 (S2). The first lower layer is in contact with the lens substrate 10. The first lower layer is the lowermost layer of the anti-reflection film 20. The first lower layer is, for example, a fluoride layer such as an $MgF_2$ layer. In the example of one or more embodiments (see FIG. 1), the eleventh layer 31 of the anti-reflection film 20 corresponds to the first lower layer.

Specifically, a ¼ wavelength optical thickness (QWOT) of the first lower layer at a design reference wavelength $\lambda_0$ of 550 nm is 0.1 or more. The ¼ wavelength optical thickness (QWOT) of the first lower layer at the design reference wavelength $\lambda_0$ is given by dividing an optical thickness of the first lower layer by $\lambda_0/4$. The optical thickness of the first lower layer is given by a product of a refractive index of the first lower layer at the design reference wavelength $\lambda_0$ and a physical thickness (nm) of the first lower layer.

As illustrated in FIG. 4, the method for manufacturing the optical lens 1 provided with the anti-reflection film according to one or more embodiments includes forming a second lower layer of the anti-reflection film 20 on the first lower layer (S3). The second lower layer is in contact with the first lower layer on the side opposite to the lens substrate 10 side with respect to the first lower layer. In the example of one or more embodiments (see FIG. 1), the tenth layer 30 of the anti-reflection film 20 corresponds to the second lower layer.

As illustrated in FIG. 4, the method for manufacturing the optical lens 1 provided with the anti-reflection film according to one or more embodiments includes forming at least one layer of the anti-reflection film 20 on the second lower layer (S4). The at least one layer of the anti-reflection film 20 is in contact with the second lower layer on the side opposite to the lens substrate 10 side with respect to the second lower layer. Specifically, the at least one layer of the anti-reflection film 20 is a plurality of layers. More specifically, the at least one layer of the anti-reflection film 20 may be at least seven layers, and the anti-reflection film 20 may include at least 10 layers. In the example of one or more embodiments (see FIG. 1), the second layer 22 to the ninth layer 29 of the anti-reflection film 20 correspond to the at least one layer of the anti-reflection film 20.

Each of the second layer 22, the fourth layer 24, the sixth layer 26, the eighth layer 28, and the tenth layer 30 of the anti-reflection film 20 is a high refractive index layer having a refractive index of 2.0 or more and 2.3 or less with respect to a design reference wavelength $\lambda_0=550$ nm. For example, each of the second layer 22, the fourth layer 24, the sixth layer 26, the eighth layer 28, and the tenth layer 30 is a $Ta_2O_5$ layer (refractive index 2.16), a $ZrO_2$ layer (refractive index 2.05), a layer formed of a mixture of $ZrTiO_4$ and $ZrO_2$ (refractive index 2.08), a $LaTiO_3$ layer (refractive index 2.1), a layer formed of a mixture of $ZrO_2$ and $TiO_2$ (refractive index 2.15), a layer formed of a mixture of $Ta_2O_5$ and $ZrO_2$ (refractive index 2.22), a layer formed of a mixture of $Ta_2O_5$ and $TiO_2$ (refractive index 2.24), a $Nb_2O_5$ layer (refractive index 2.3), or a $TiO_2$ layer (refractive index 2.3).

Each of the third layer 23, the fifth layer 25, the seventh layer 27, and the ninth layer 29 of the anti-reflection film 20 is a low refractive index layer having a refractive index of 1.44 or more and 1.50 or less with respect to a design reference wavelength $\lambda_0=550$ nm. For example, each of the third layer 23, the fifth layer 25, the seventh layer 27, and the ninth layer 29 of the anti-reflection film 20 is an $SiO_2$ layer.

As illustrated in FIG. 4, the method for manufacturing the optical lens 1 provided with the anti-reflection film according to one or more embodiments includes forming an uppermost layer of the anti-reflection film 20 on the at least one layer (S5). The uppermost layer is a layer that is closest to the air side of the anti-reflection film 20. The uppermost layer is a layer of the anti-reflection film 20 that is most distal from the lens substrate 10. The uppermost layer is, for example, a fluoride layer such as an $MgF_2$ layer. In the example of one or more embodiments (see FIG. 1), the first layer 21 of the anti-reflection film 20 corresponds to the uppermost layer. The at least one layer (the second layer 22 to the ninth layer 29 in the example of FIG. 1) of the anti-reflection film 20 is in contact with the second lower layer (the tenth layer 30 in the example of FIG. 1) and the uppermost layer (the first layer 21 in the example of FIG. 1) of the anti-reflection film 20 in the thickness direction of the lens substrate 10.

The first energy and the first amount per unit time of the ions reaching the first lower layer and at least the lower half of the second lower layer while forming the first lower layer (the eleventh layer 31 in the example of FIG. 1) and at least the lower half of the second lower layer (the tenth layer 30 in the example of FIG. 1) are respectively smaller than the second energy and the second amount per unit time of the ions reaching the at least one layer while forming the at least one layer (the second layer 22 to the ninth layer 29 in the example of FIG. 1). The lower half of the second lower layer is a portion of the second lower layer on a side of the first lower layer with respect to a center of the second lower layer in a thickness direction of the second lower layer.

In the present description, when the energy of the ions reaching the at least one layer changes while forming the at least one layer, the second energy means the minimum value of the energy of the ions reaching the at least one layer while forming the at least one layer. When the amount per unit time of the ions reaching the at least one layer changes while forming the at least one layer, the second amount per unit time means a minimum value of the amount per unit time of the ions reaching the at least one layer while forming the at least one layer.

In the present description, when the energy of the ions reaching the first lower layer and at least the lower half of the second lower layer changes while forming the first lower layer and at least the lower half of the second lower layer, the first energy means the maximum value of the energy of the ions reaching the first lower layer and at least the lower half of the second lower layer while forming the first lower layer and at least the lower half of the second lower layer. When the amount of the ions reaching the first lower layer and at least the lower half of the second lower layer per unit time changes while forming the first lower layer and at least the lower half of the second lower layer, the first amount per unit time means the maximum value of the amount per unit time of the ions reaching the first lower layer and at least the lower half of the second lower layer while forming the first lower layer and at least the lower half of the second lower layer.

When the ions do not reach the first lower layer and at least the lower half of the second lower layer while forming the first lower layer and at least the lower half of the second lower layer, the first energy is regarded as zero, and the first amount per unit time is regarded as zero.

As a method of making the first energy and the first amount per unit time smaller than the second energy and the second amount per unit time, respectively, there are the following two methods, for example.

In the first method, a first ion acceleration voltage and a first ion current of the ion source 51 while forming the first lower layer (the eleventh layer 31 in the example of FIG. 1) and at least the lower half of the second lower layer (the tenth layer 30 in the example of FIG. 1) are set to be respectively smaller than a second ion acceleration voltage and a second ion current of the ion source 51 while forming the at least one layer (the second layer 22 to the ninth layer 29 in the example of FIG. 1) of the anti-reflection film 20. For example, the first ion acceleration voltage is 300 V or less, and the first ion current is 300 mA or less. For example, the second ion acceleration voltage is 500 V or more, and the second ion current is 500 mA or more. When the ion acceleration voltage of the ion source 51 decreases, the energy of ions reaching the surface to be deposited decreases. When the ion current of the ion source 51 decreases, the amount of ions per unit time reaching the surface to be deposited decreases.

In the second method, while forming the first lower layer (the eleventh layer 31 in the example of FIG. 1) and at least the lower half of the second lower layer (the tenth layer 30 in the example of FIG. 1), the movable shutter 52 is inserted into a path of the ions from the ion source 51 to the lens substrate 10. The movable shutter 52 blocks ions from reaching the surface to be deposited such as the lens substrate 10. By inserting the movable shutter 52 into the path of the ions from the ion source 51 to the lens substrate 10, the ions do not reach the surface to be deposited. The first energy is considered as zero, and the first amount per unit time is considered as zero. While forming the at least one layer (the second layer 22 to the ninth layer 29 in the example of FIG. 1) of the anti-reflection film 20, the movable shutter 52 is retracted from the path of the ions to cause the ions to reach the surface to be deposited such as the lens substrate 10.

Specifically, the first ion acceleration voltage and the first ion current of the ion source 51 while forming the first lower layer (the eleventh layer 31 in the example of FIG. 1) and the entirety of the second lower layer (the tenth layer 30 in the example of FIG. 1) may be set to be respectively smaller than the second ion acceleration voltage and the second ion current of the ion source 51 while forming the at least one layer (the second layer 22 to the ninth layer 29 in the example of FIG. 1) of the anti-reflection film 20. For example, the ions reaching the entirety of the second lower layer while forming the entirety of the second lower layer may have the first energy and the first amount per unit time.

Specifically, as an example, the first ion acceleration voltage and the first ion current of the ion source 51 while forming the first lower layer and the entirety of the second lower layer may be set to be respectively smaller than the second ion acceleration voltage and the second ion current of the ion source 51 while forming the at least one layer of the anti-reflection film 20. As another example, while forming the first lower layer and the entirety of the second lower layer, the movable shutter 52 may be inserted into the path of the ions from the ion source 51 to the lens substrate 10. While forming the at least one layer of the anti-reflection film 20, the movable shutter 52 may be retracted from the path of the ions from the ion source 51 to the lens substrate 10.

Specifically, fourth energy and a fourth amount per unit time of the ions reaching a portion farthest from the lens substrate 10 in the second lower layer while forming the portion farthest from the lens substrate 10 in the second lower layer (the tenth layer 30 in the example of FIG. 1) are larger than the first energy and the first amount per unit time, respectively. For example, the fourth energy and the fourth amount per unit time of the ions reaching the portion farthest from the lens substrate 10 in the second lower layer while forming the portion farthest from the lens substrate 10 in the second lower layer may be equal to the second energy and the second amount per unit time, respectively.

Specifically, as an example, the ion beam when forming the portion of the second lower layer farthest from the lens substrate 10 has the second ion acceleration voltage and the second ion current. As another example, when forming the portion of the second lower layer farthest from the lens substrate 10, the movable shutter 52 is retracted from the path of the ions from the ion source 51 to the lens substrate 10.

More specifically, the fourth energy and the fourth amount per unit time of the ions reaching the portion farthest from the lens substrate 10 in the second lower layer while forming an upper half of the second lower layer (the tenth layer 30 in the example of FIG. 1) are larger than the first energy and the first amount per unit time, respectively. For example, the fourth energy and the fourth amount per unit time of the ions reaching the portion of the second lower layer most distant from the lens substrate 10 while forming the upper half of the second lower layer may be equal to the second energy and the second amount per unit time, respectively. The upper half of the second lower layer is a portion of the second lower layer on a side of the at least one layer of the anti-reflection film 20 (a side opposite to the lens substrate 10 side) with respect to the center of the second lower layer in the thickness direction of the second lower layer.

Specifically, as an example, the fourth ion acceleration voltage and the fourth ion current of the ion source 51 while forming the upper half of the second lower layer may be made respectively equal to the second ion acceleration voltage and the second ion current of the ion source 51 while forming the at least one layer of the anti-reflection film 20. As another example, the movable shutter 52 may be retracted from the path of the ions from the ion source 51 to the lens substrate 10 while forming the upper half of the second lower layer.

The uppermost layer (the first layer 21 in the example of FIG. 1) is a fluoride layer such as an MgF$_2$ layer. Third energy and a third amount per unit time of the ions reaching the uppermost layer while forming the uppermost layer are smaller than the second energy and the second amount per unit time, respectively. Specifically, the third energy and the third amount per unit time may be equal to the first energy and the first amount per unit time, respectively.

Specifically, as an example, the third ion acceleration voltage and the third ion current of the ion source 51 while forming the uppermost layer may be set to be respectively smaller than the second ion acceleration voltage and the second ion current of the ion source 51 while forming at least one layer (the second layer 22 to the ninth layer 29 in the example of FIG. 1) of the anti-reflection film 20.

Specifically, the third ion acceleration voltage and the third ion current may be equal to the first ion acceleration voltage and the first ion current, respectively. As another example, while forming the uppermost layer, the movable shutter 52 may be inserted into the path of the ions from the ion source 51 to the lens substrate 10.

EXAMPLES

Example 1

An optical lens 1 provided with an anti-reflection film of Example 1 will be described with reference to FIG. 1. A configuration of the optical lens 1 provided with the anti-reflection film of Example 1 is illustrated in Table 2. Specifically, a glass material used as the lens substrate 10 is FCD1 (manufactured by HOYA Corporation). The lens substrate 10 formed of FCD1 has a refractive index $n_s$ of 1.50 at a wavelength of 587.56 nm (d-line). The anti-reflection film 20 is formed on the lens substrate 10. The anti-reflection film 20 includes 11 layers. When counted from the air side, the first layer 21 of the anti-reflection film 20 is an $MgF_2$ layer. When counted from the air side, each of the second layer 22, the fourth layer 24, the sixth layer 26, the eighth layer 28, and the tenth layer 30 of the anti-reflection film 20 is a $Ta_2O_5$ layer. Each of the third layer 23, the fifth layer 25, the seventh layer 27, and the ninth layer 29 of the anti-reflection film 20 is an $SiO_2$ layer. The eleventh layer 31 of the anti-reflection film 20 is an $MgF_2$ layer.

TABLE 2

Example 1 (design reference wavelength $\lambda_0$ = 550 nm)

| Layer | Material | QWOT |
|---|---|---|
| Medium | Air (n = 1.00) | |
| First layer | $MgF_2$ | 0.95 |
| Second layer | $Ta_2O_5$ | 1.95 |
| Third layer | $SiO_2$ | 0.80 |
| Fourth layer | $Ta_2O_5$ | 0.16 |
| Fifth layer | $SiO_2$ | 0.78 |
| Sixth layer | $Ta_2O_5$ | 0.79 |
| Seventh layer | $SiO_2$ | 0.13 |
| Eighth layer | $Ta_2O_5$ | 0.93 |
| Ninth layer | $SiO_2$ | 0.42 |
| Tenth layer | $Ta_2O_5$ | 0.28 |
| Eleventh layer | $MgF_2$ | 0.15 |
| Lens substrate | FCD1 ($n_s$ = 1.50 (wavelength 587.56 nm)) | |

The first layer 21 corresponds to the uppermost layer of the anti-reflection film 20. The second layer 22 to the ninth layer 29 correspond to the at least one layer of the anti-reflection film 20. The tenth layer 30 corresponds to the second lower layer of the anti-reflection film 20. The eleventh layer 31 corresponds to the first lower layer of the anti-reflection film 20. The ¼ wavelength optical thickness (QWOT) of the eleventh layer 31 is 0.15.

Figure 5:
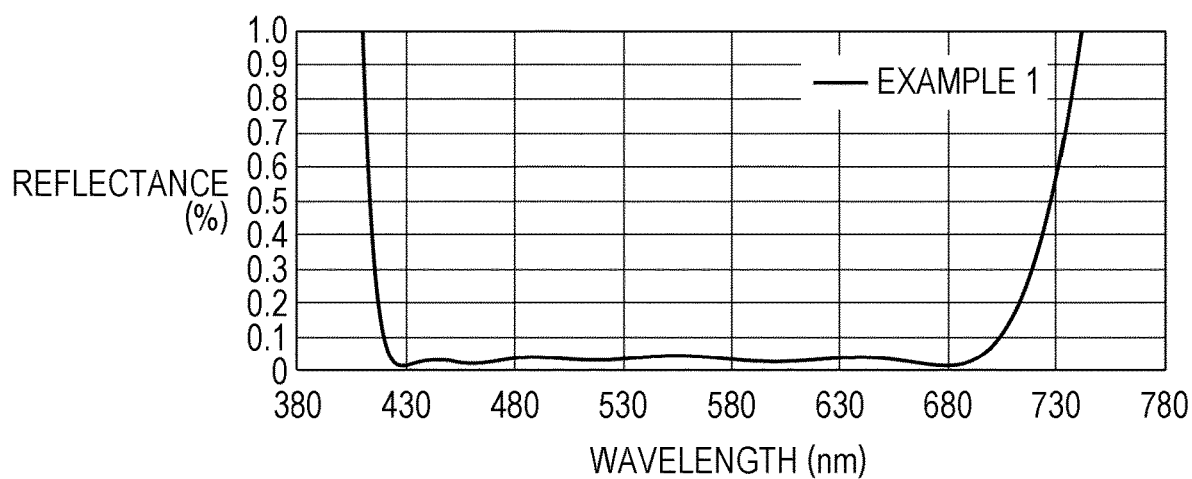
FIG. 5 is a diagram illustrating a simulation result of a reflection spectrum of the anti-reflection film of Example 1.

FIG. 5 illustrates a simulation result of a reflection spectrum of the anti-reflection film 20 of this example. The maximum reflectance of the anti-reflection film 20 of this example in the wavelength range of 430 nm or more and 670 nm or less is 0.2% or less. The maximum reflectance of the anti-reflection film 20 of this example in the wavelength range of 430 nm or more and 670 nm or less is 0.1% or less.

A method for manufacturing the optical lens 1 provided with the anti-reflection film of this example will be described. The tenth layer 30 corresponding to the second lower layer and the eleventh layer 31 corresponding to the first lower layer are formed on the lens substrate 10 by a vacuum deposition method without ion assist. When the eleventh layer 31 is formed by the ion-assisted deposition method, the ions collide with the eleventh layer 31 formed of a fluoride layer. When the ions collide with the eleventh layer 31, fluorine is desorbed from the eleventh layer 31, and the light absorption rate of the eleventh layer 31 increases. On the other hand, in this example, the eleventh layer 31 is formed by the vacuum deposition method without ion assist. Thus, when the eleventh layer 31 is formed, desorption of fluorine from the eleventh layer 31 is suppressed. The light absorption rate of the eleventh layer 31 can be kept low.

When the tenth layer 30 in contact with the eleventh layer 31 is formed by the ion-assisted deposition method, the ions may collide with the eleventh layer 31 formed of a fluoride layer. When the ions collide with the eleventh layer 31, fluorine is desorbed from the eleventh layer 31, and the light absorption rate of the eleventh layer 31 increases. On the other hand, in this example, the tenth layer 30 is formed by the vacuum deposition method without ion assist. Thus, when the tenth layer 30 is formed, the ions are prevented from colliding with the eleventh layer 31. When the tenth layer 30 is formed, the desorption of fluorine from the eleventh layer 31 is suppressed. The light absorption rate of the eleventh layer 31 can be kept low.

The second layer 22 to the ninth layer 29 are formed on the tenth layer 30 by a vacuum deposition method using ion assist. Examples of ion assist conditions when forming each of the second layer 22 to the ninth layer 29 are as follows. The seventh layer 27 and the ninth layer 29 are formed under ion assist conditions including a film formation rate of 4 Å/sec, an ion acceleration voltage of 900 V, an ion current of 900 mA, an assist gas of oxygen, and a flow rate of the assist gas of 60 sccm. The second layer 22, the fourth layer 24, the sixth layer 26, and the eighth layer 28 are formed under ion assist conditions including a film formation rate of 2 Å/sec, the ion acceleration voltage of 900 V, the ion current of 900 mA, the assist gas of oxygen, and the flow rate of the assist gas of 60 sccm. The third layer 23 and the fifth layer 25 are formed under ion assist conditions including a film formation rate of 8 Å/sec, the ion acceleration voltage of 900 V, the ion current of 900 mA, the assist gas of oxygen, and the flow rate of the assist gas of 60 sccm.

The ion-assisted deposition reduces variations in the film density of the anti-reflection film 20 and surface roughness of the film due to variations in the degree of vacuum in the vacuum deposition method, and the like. The variation in the film density leads to variations in refractive index of the film. The surface roughness of the film leads to variations in film thickness. The variations in the refractive index of the film and the variations in the film thickness cause color unevenness in the anti-reflection film 20 and reduce the reproducibility of the reflection characteristics of the anti-reflection film 20. The ion-assisted deposition suppresses occurrence of the color unevenness in the anti-reflection film 20 and improves the reproducibility of the reflection characteristics of the anti-reflection film 20. When ion-assisted deposition is used to form at least one layer (in this example, the second layer 22 to the ninth layer 29) of the anti-reflection film 20, it is possible to use a high refractive index material that has been relatively difficult to use conventionally for the at least one layer (in this example, the second layer 22 to the ninth layer 29) of the anti-reflection film 20.

The first layer 21 is formed on the second layer 22 by the vacuum deposition method without ion assist. When the first layer 21 is formed by the ion-assisted deposition method, the ions collide with the first layer 21 formed of a fluoride layer, and fluorine is desorbed from the first layer 21. The light absorption rate of the first layer 21 becomes high. On the other hand, in this example, the first layer 21 is formed by the vacuum deposition method without ion assist. Thus, the light absorption rate of the first layer 21 can be kept low.

A peeling test of the anti-reflection film 20 was performed on the optical lens 1 provided with the anti-reflection film of this example. In the peeling test, an adhesive tape is adhered to a surface of the anti-reflection film 20 of the optical lens 1 provided with the anti-reflection film, and then the adhesive tape is peeled off from the optical lens 1 provided with the anti-reflection film. In this example, although FCD1 (manufactured by HOYA Corporation) containing 40 mass % or more of fluoride was employed as the material of the lens substrate 10, the anti-reflection film 20 was prevented from peeling off from the lens substrate 10 even when the adhesive tape was peeled off from the optical lens 1 provided with the anti-reflection film.

Example 2

An optical lens 1 provided with an anti-reflection film of Example 2 will be described with reference to FIG. 1. A configuration of the optical lens 1 provided with the anti-reflection film of this example is illustrated in Table 3. Specifically, the glass material used as the lens substrate 10 is FCD100 (manufactured by HOYA Corporation). The lens substrate 10 formed of the FCD100 has a refractive index $n_s$ of 1.44 at a wavelength of 587.56 nm (d-line). The anti-reflection film 20 is formed on the lens substrate 10. The anti-reflection film 20 includes 11 layers. When counted from the air side, the first layer 21 of the anti-reflection film 20 is an $MgF_2$ layer. When counted from the air side, each of the second layer 22, the fourth layer 24, the sixth layer 26, the eighth layer 28, and the tenth layer 30 of the anti-reflection film 20 is a $Ta_2O_5$ layer. Each of the third layer 23, the fifth layer 25, the seventh layer 27, and the ninth layer 29 of the anti-reflection film 20 is an $SiO_2$ layer. The eleventh layer 31 of the anti-reflection film 20 is an $MgF_2$ layer.

TABLE 3

Example 2 (design reference wavelength $\lambda_0$ = 550 nm)

| Layer | Material | QWOT |
| --- | --- | --- |
| Medium | Air (n = 1.00) | |
| First layer | $MgF_2$ | 0.94 |
| Second layer | $Ta_2O_5$ | 1.95 |
| Third layer | $SiO_2$ | 0.80 |
| Fourth layer | $Ta_2O_5$ | 0.20 |
| Fifth layer | $SiO_2$ | 0.74 |
| Sixth layer | $Ta_2O_5$ | 0.81 |
| Seventh layer | $SiO_2$ | 0.13 |
| Eighth layer | $Ta_2O_5$ | 0.90 |
| Ninth layer | $SiO_2$ | 0.45 |
| Tenth layer | $Ta_2O_5$ | 0.24 |
| Eleventh layer | $MgF_2$ | 0.10 |
| Lens substrate | FCD100 ($n_s$ = 1.44 (wavelength 587.56 nm)) | |

The first layer 21 corresponds to the uppermost layer of the anti-reflection film 20. The second layer 22 to the ninth layer 29 correspond to the at least one layer of the anti-reflection film 20. The tenth layer 30 corresponds to the second lower layer of the anti-reflection film 20. The eleventh layer 31 corresponds to the first lower layer of the anti-reflection film 20. The ¼ wavelength optical thickness (QWOT) of the eleventh layer 31 is 0.10.

Figure 6:
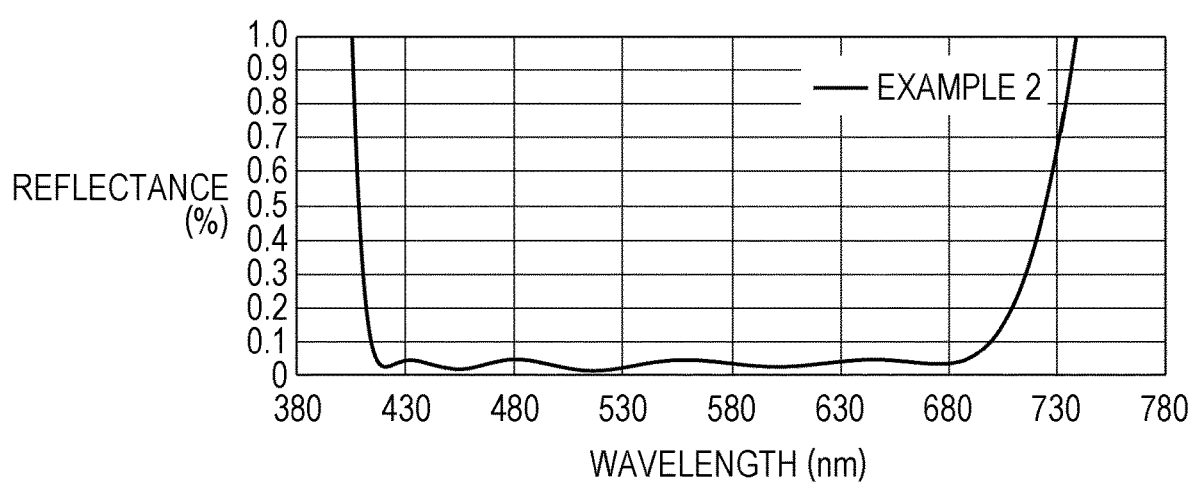
FIG. 6 is a diagram illustrating a simulation result of a reflection spectrum of the anti-reflection film of Example 2.

FIG. 6 illustrates a simulation result of the reflection spectrum of the anti-reflection film 20 of this example. The maximum reflectance of the anti-reflection film 20 of this example in the wavelength range of 430 nm or more and 670 nm or less is 0.2% or less. The maximum reflectance of the anti-reflection film 20 of this example in the wavelength range of 430 nm or more and 670 nm or less is 0.1% or less.

A method for manufacturing the optical lens 1 provided with the anti-reflection film of this example will be described. The tenth layer 30 corresponding to the second lower layer and an eleventh layer 31 corresponding to the first lower layer are formed on the lens substrate 10 by the vacuum deposition method without ion assist. Thus, similarly to Example 1, the light absorption rate of the eleventh layer 31 is prevented from increasing.

The second layer 22 to the ninth layer 29 are formed on the tenth layer 30 by the ion-assisted deposition method. Examples of ion assist conditions when forming each of the second layer 22 to the ninth layer 29 are as follows. The third layer 23, the fifth layer 25, and the ninth layer 29 are formed under ion assist conditions including the film formation rate of 8 Å/sec, the ion acceleration voltage of 900 V, the ion current of 900 mA, the assist gas of oxygen, and the flow rate of the assist gas of 60 sccm. The second layer 22, the fourth layer 24, the sixth layer 26, and the eighth layer 28 are formed under ion assist conditions including the film formation rate of 2 Å/sec, the ion acceleration voltage of 900 V, the ion current of 900 mA, the assist gas of oxygen, and the flow rate of the assist gas of 60 sccm. The seventh layer 27 is formed under ion assist conditions including the film formation rate of 4 Å/sec, the ion acceleration voltage of 900 V, the ion current of 900 mA, the assist gas of oxygen, and the flow rate of the assist gas of 60 sccm.

By a method similar to that for Example 1, the first layer 21 is formed on the second layer 22 by the vacuum deposition method without ion assist. Thus, the light absorption rate of the first layer 21 is prevented from increasing.

The peeling test of the anti-reflection film 20 described in Example 1 was performed on the optical lens 1 provided with the anti-reflection film of this example. In this example, even when the adhesive tape is peeled off from the optical lens 1 provided with the anti-reflection film, the anti-reflection film 20 is prevented from peeling off from the lens substrate 10 even though FCD100 (manufactured by HOYA Corporation) containing 40 mass % or more of fluoride is employed as the material of the lens substrate 10.

Example 3

Figure 7:
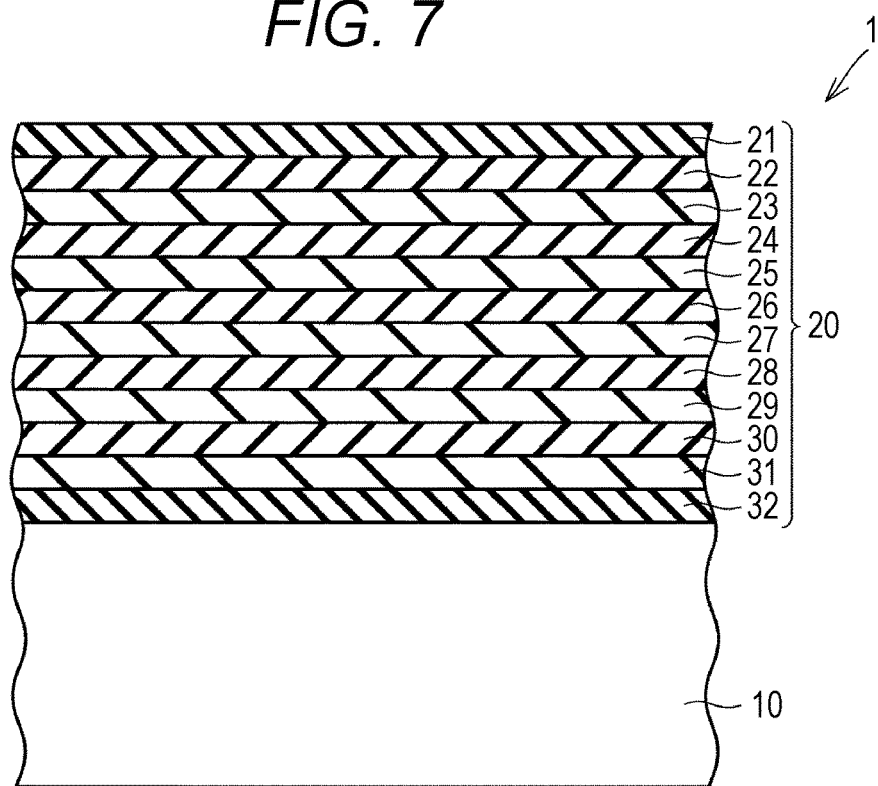
FIG. 7 is a partially enlarged cross-sectional view of an optical lens provided with an anti-reflection film of Example 3.

An optical lens 1 provided with an anti-reflection film of Example 3 will be described with reference to FIG. 7. A configuration of the optical lens 1 provided with the anti-reflection film of this example is illustrated in Table 4. Specifically, the glass material used as the lens substrate 10 is FCD1 (manufactured by HOYA Corporation). The anti-reflection film 20 is formed on the lens substrate 10. The anti-reflection film 20 includes 12 layers. When counted from the air side, the first layer 21 of the anti-reflection film 20 is an $MgF_2$ layer. When counted from the air side, each of the second layer 22, the fourth layer 24, the sixth layer 26, the eighth layer 28, and the tenth layer 30 of the anti-reflection film 20 is a $Ta_2O_5$ layer. Each of the third layer 23, the fifth layer 25, the seventh layer 27, the ninth layer 29, and the eleventh layer 31 of the anti-reflection film 20 is an $SiO_2$ layer. A twelfth layer 32 of the anti-reflection film 20 is an $MgF_2$ layer.

TABLE 4

Example 3 (design reference wavelength $\lambda_0$ = 550 nm)

| Layer | Material | QWOT |
|---|---|---|
| Medium | Air (n = 1.00) | |
| First layer | MgF$_2$ | 0.92 |
| Second layer | Ta$_2$O$_5$ | 1.91 |
| Third layer | SiO$_2$ | 0.72 |
| Fourth layer | Ta$_2$O$_5$ | 0.20 |
| Fifth layer | SiO$_2$ | 0.70 |
| Sixth layer | Ta$_2$O$_5$ | 0.75 |
| Seventh layer | SiO$_2$ | 0.13 |
| Eighth layer | Ta$_2$O$_5$ | 0.84 |
| Ninth layer | SiO$_2$ | 0.36 |
| Tenth layer | Ta$_2$O$_5$ | 0.20 |
| Eleventh layer | SiO$_2$ | 1.35 |
| Twelfth layer | MgF$_2$ | 0.15 |
| Lens substrate | FCD1 ($n_s$ = 1.50 (wavelength 587.56 nm)) | |

The first layer 21 corresponds to the uppermost layer of the anti-reflection film 20. The second layer 22 to the tenth layer 30 correspond to the at least one layer of the anti-reflection film 20. The eleventh layer 31 corresponds to the second lower layer of the anti-reflection film 20. The twelfth layer 32 corresponds to the first lower layer of the anti-reflection film 20. The ¼ wavelength optical thickness (QWOT) of the twelfth layer 32 is 0.15.

Figure 8:
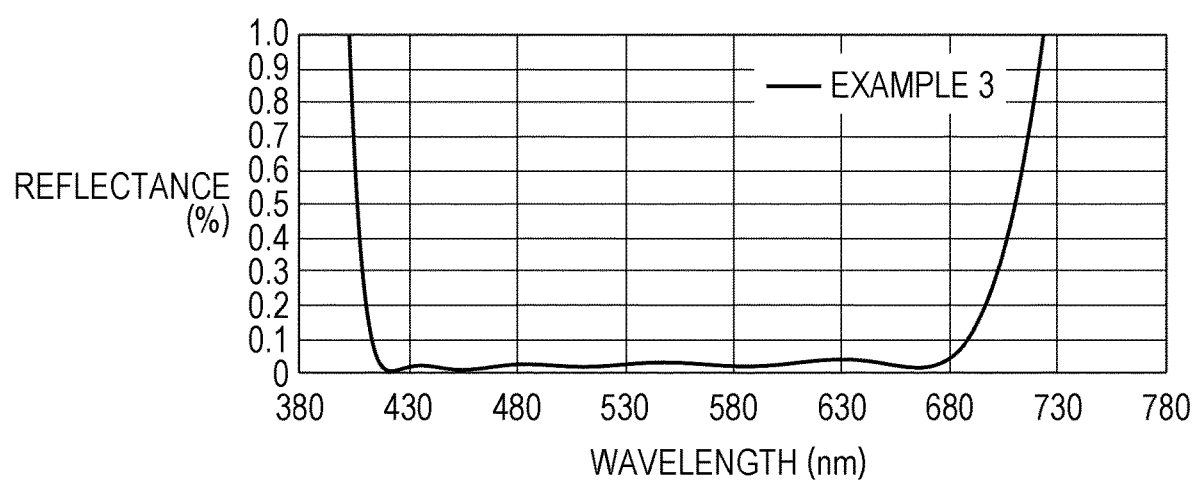
FIG. 8 is a diagram illustrating a simulation result of a reflection spectrum of the anti-reflection film of Example 3.

FIG. 8 illustrates a simulation result of the reflection spectrum of the anti-reflection film 20 of this example. The maximum reflectance of the anti-reflection film 20 of this example in the wavelength range of 430 nm or more and 670 nm or less is 0.2% or less. The maximum reflectance of the anti-reflection film 20 of this example in the wavelength range of 430 nm or more and 670 nm or less is 0.1% or less.

A method for manufacturing the optical lens 1 provided with the anti-reflection film of this example will be described. A lower half of the eleventh layer 31 and the twelfth layer 32 are formed on the lens substrate 10 by the vacuum deposition method without ion assist. Thus, similarly to Example 1, the light absorption rate of the twelfth layer 32 is prevented from increasing.

The second layer 22 to the tenth layer 30 and an upper half of the eleventh layer 31 are formed by the ion-assisted deposition method. Examples of the ion assist conditions when forming each of the tenth layer 30 and the upper half of the eleventh layer 31 from the second layer 22 are as follows. The third layer 23, the fifth layer 25, and the upper half of the eleventh layer 31 are formed under ion assist conditions including the film formation rate of 8 Å/sec, the ion acceleration voltage of 900 V, the ion current of 900 mA, the assist gas of oxygen, and the flow rate of the assist gas of 60 sccm. The second layer 22, the fourth layer 24, the sixth layer 26, the eighth layer 28, and the tenth layer 30 are formed under ion assist conditions including the film formation rate of 2 Å/sec, the ion acceleration voltage of 900 V, the ion current of 900 mA, the assist gas of oxygen, and the flow rate of the assist gas of 60 sccm. The seventh layer 27 and the ninth layer 29 are formed under ion assist conditions including the film formation rate of 4 Å/sec, the ion acceleration voltage of 900 V, the ion current of 900 mA, the assist gas of oxygen, and the flow rate of the assist gas of 60 sccm.

By a method similar to that for Example 1, the first layer 21 is formed on the second layer 22 by the vacuum deposition method without ion assist. Thus, the light absorption rate of the first layer 21 is prevented from increasing.

The peeling test of the anti-reflection film 20 described in Example 1 was performed on the optical lens 1 provided with the anti-reflection film of this example. In this example, although FCD1 (manufactured by HOYA Corporation) containing 40 mass % or more of fluoride was employed as the material of the lens substrate 10, the anti-reflection film 20 was prevented from peeling off from the lens substrate 10 even when the adhesive tape was peeled off from the optical lens 1 provided with the anti-reflection film.

Example 4

Figure 9:
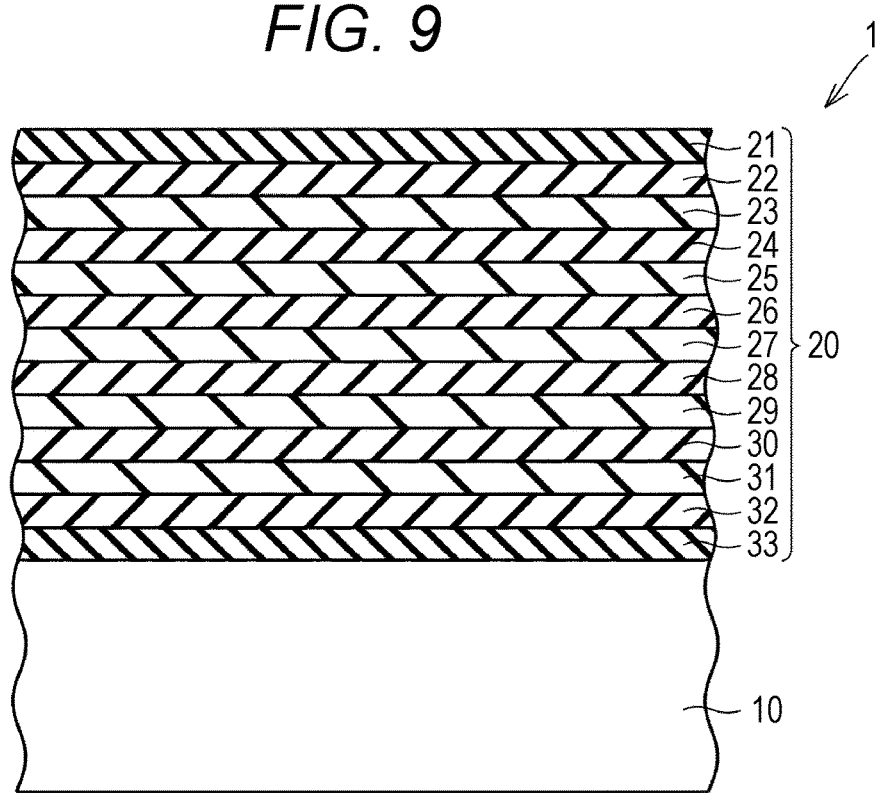
FIG. 9 is a partially enlarged cross-sectional view of an optical lens provided with an anti-reflection film of Example 4.

An optical lens 1 provided with an anti-reflection film of Example 4 will be described with reference to FIG. 9. A configuration of the optical lens 1 provided with the anti-reflection film of this example is illustrated in Table 5. Specifically, the glass material used as the lens substrate 10 is FCD1 (manufactured by HOYA Corporation). The anti-reflection film 20 is formed on the lens substrate 10. The anti-reflection film 20 includes 13 layers. When counted from the air side, the first layer 21 of the anti-reflection film 20 is an MgF$_2$ layer. When counted from the air side, each of the second layer 22, the fourth layer 24, the sixth layer 26, the eighth layer 28, the tenth layer 30, and the twelfth layer 32 of the anti-reflection film 20 is a Ta$_2$O$_5$ layer. Each of the third layer 23, the fifth layer 25, the seventh layer 27, the ninth layer 29, and the eleventh layer 31 of the anti-reflection film 20 is an SiO$_2$ layer. A thirteenth layer 33 of the anti-reflection film 20 is an MgF$_2$ layer.

TABLE 5

Example 4 (design reference wavelength $\lambda_0$ = 550 nm)

| Layer | Material | QWOT |
|---|---|---|
| Medium | Air (n = 1.00) | |
| First layer | MgF$_2$ | 1.07 |
| Second layer | Ta$_2$O$_5$ | 0.53 |
| Third layer | SiO$_2$ | 0.19 |
| Fourth layer | Ta$_2$O$_5$ | 1.27 |
| Fifth layer | SiO$_2$ | 0.33 |
| Sixth layer | Ta$_2$O$_5$ | 0.40 |
| Seventh layer | SiO$_2$ | 0.98 |
| Eighth layer | Ta$_2$O$_5$ | 0.13 |
| Ninth layer | SiO$_2$ | 1.05 |
| Tenth layer | Ta$_2$O$_5$ | 0.20 |
| Eleventh layer | SiO$_2$ | 0.75 |
| Twelfth layer | Ta$_2$O$_5$ | 0.17 |
| Thirteenth layer | MgF$_2$ | 0.10 |
| Lens substrate | FCD1 ($n_s$ = 1.50 (wavelength 587.56 nm)) | |

Figure 10:
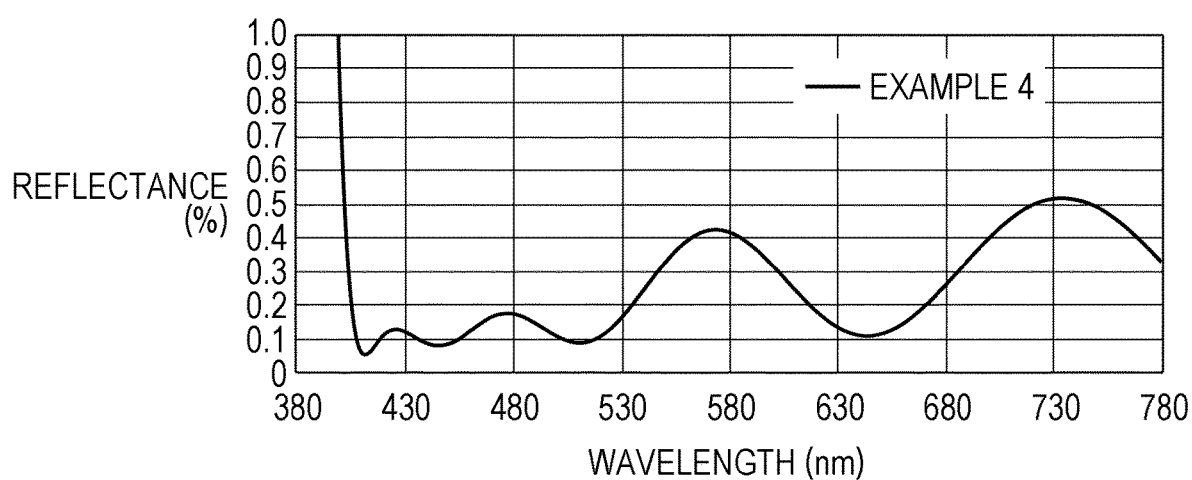
FIG. 10 is a diagram illustrating a simulation result of a reflection spectrum of the anti-reflection film of Example 4.

The first layer 21 corresponds to the uppermost layer of the anti-reflection film 20. The second layer 22 to the eleventh layer 31 correspond to the at least one layer of the anti-reflection film 20. The twelfth layer 32 corresponds to the second lower layer of the anti-reflection film 20. The thirteenth layer 33 corresponds to the first lower layer of the anti-reflection film 20. The ¼ wavelength optical thickness (QWOT) of the thirteenth layer is 0.10. FIG. 10 illustrates a simulation result of the reflection spectrum of the anti-reflection film 20 of this example.

A method for manufacturing the optical lens 1 provided with the anti-reflection film of this example will be described. The twelfth layer 32 and the thirteenth layer 33 are formed on the lens substrate 10 by the vacuum deposition method without ion assist. Thus, similarly to Example 1, the light absorption rate of the thirteenth layer 33 is prevented from increasing.

On the twelfth layer 32, the second layer 22 to the eleventh layer 31 are formed by the ion-assisted deposition method. Examples of the ion assist condition when forming each of the second layer 22 to the eleventh layer 31 are as follows. The seventh layer 27, the ninth layer 29, and the eleventh layer 31 are formed under ion assist conditions including the film formation rate of 8 Å/sec, the ion acceleration voltage of 900 V, the ion current of 900 mA, the assist gas of oxygen, and the flow rate of the assist gas of 60 sccm. The second layer 22, the fourth layer 24, the sixth layer 26, the eighth layer 28, and the tenth layer 30 are formed under ion assist conditions including the film formation rate of 2 Å/sec, the ion acceleration voltage of 900 V, the ion current of 900 mA, the assist gas of oxygen, and the flow rate of the assist gas of 60 sccm. The third layer 23 and the fifth layer 25 are formed under ion assist conditions including the film formation rate of 4 Å/sec, the ion acceleration voltage of 900 V, the ion current of 900 mA, the assist gas of oxygen, and the flow rate of the assist gas of 60 sccm.

By a method similar to that for Example 1, the first layer 21 is formed on the second layer 22 by the vacuum deposition method without ion assist. Thus, the light absorption rate of the first layer 21 is prevented from increasing.

The peeling test of the anti-reflection film 20 described in Example 1 was performed on the optical lens 1 provided with the anti-reflection film of this example. In this example, although FCD1 (manufactured by HOYA Corporation) containing 40 mass % or more of fluoride was employed as the material of the lens substrate 10, the anti-reflection film 20 was prevented from peeling off from the lens substrate 10 even when the adhesive tape was peeled off from the optical lens 1 provided with the anti-reflection film.

Example 5

Figure 11:
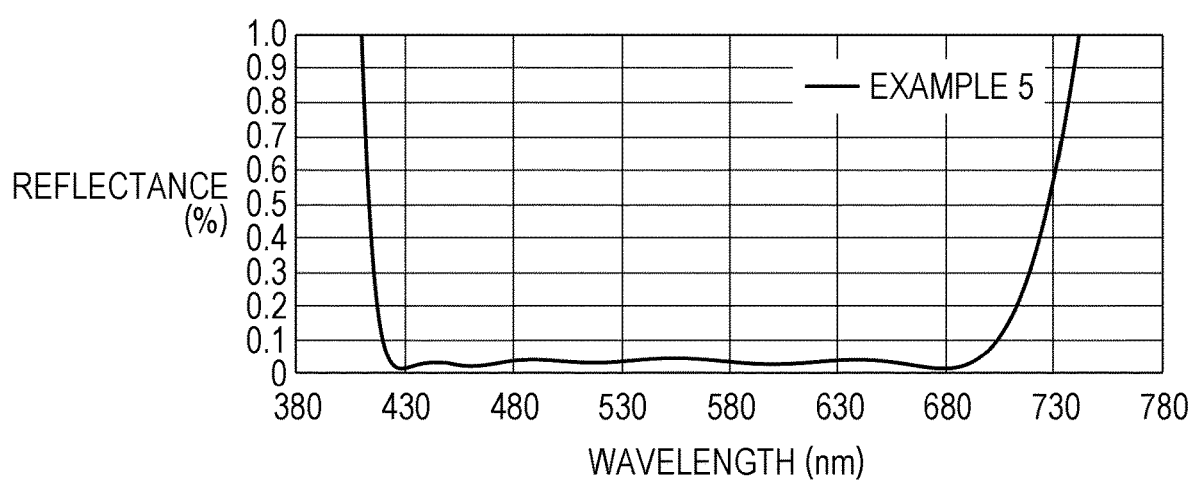
FIG. 11 is a diagram illustrating a simulation result of the reflection spectrum of the anti-reflection film of Example 5.

An optical lens 1 provided with an anti-reflection film of Example 5 will be described with reference to FIG. 1. A configuration of the optical lens 1 provided with the anti-reflection film of this example is the same as the configuration of the optical lens 1 provided with the anti-reflection film of Example 1 illustrated in Table 1. FIG. 11 illustrates a simulation result of the reflection spectrum of the anti-reflection film 20 of this example.

A method for manufacturing the optical lens 1 provided with the anti-reflection film of this example will be described. The method for manufacturing the optical lens 1 provided with the anti-reflection film of this example is similar to the method for manufacturing the optical lens 1 provided with the anti-reflection film of Example 1, but is different in ion assist conditions when forming the tenth layer 30 and the eleventh layer 31.

In this example, the eleventh layer 31 is formed under ion assist conditions including a film formation rate of 3 Å/sec, an ion acceleration voltage of 200 V, an ion current of 200 mA, the assist gas of oxygen, and the flow rate of the assist gas of 60 sccm. The tenth layer 30 is formed under ion assist conditions including the film formation rate of 2 Å/sec, the ion acceleration voltage of 200 V, the ion current of 200 mA, the assist gas of oxygen, and the flow rate of the assist gas of 60 sccm.

The first ion acceleration voltage (for example, 200 V) when forming the eleventh layer 31 is smaller than the second ion acceleration voltage (for example, 900 V) when forming each of the second layer 22 to the ninth layer 29. The first ion current (for example, 200 mA) when forming the eleventh layer 31 is smaller than the second ion current (for example, 900 mA) when forming each of the second layer 22 to the ninth layer 29. Thus, when the eleventh layer 31 is formed, the desorption of fluorine from the eleventh layer 31 is suppressed. The light absorption rate of the eleventh layer 31 is prevented from increasing.

Further, the first ion acceleration voltage (for example, 200 V) when forming the tenth layer 30 is smaller than the second ion acceleration voltage (for example, 900 V) when forming each of the second layer 22 to the ninth layer 29. The first ion current (for example, 200 mA) when forming the tenth layer 30 is smaller than the second ion current (for example, 900 mA) when forming each of the second layer 22 to the ninth layer 29. Thus, when the tenth layer 30 is formed, the ions are prevented from colliding with the eleventh layer 31. When the tenth layer 30 is formed, the desorption of fluorine from the eleventh layer 31 is suppressed. The light absorption rate of the eleventh layer 31 is further prevented from increasing.

<Projection Lens and Projection Lens Optical System LN>

A projection lens and a projection lens optical system LN according to one or more embodiments will be described with reference to FIG. 12.

The projection lens optical system LN includes a plurality of projection lenses. The projection lens optical system LN includes, for example, 30 projection lenses. In order to obtain a wide angle of view and excellent projection performance, the projection lens optical system LN uses relay lenses. Thus, the number of projection lenses constituting the projection lens optical system LN increases. The optical lens 1 provided with the anti-reflection film according to one or more embodiments is applied to at least one of the plurality of projection lenses.

Figure 12:
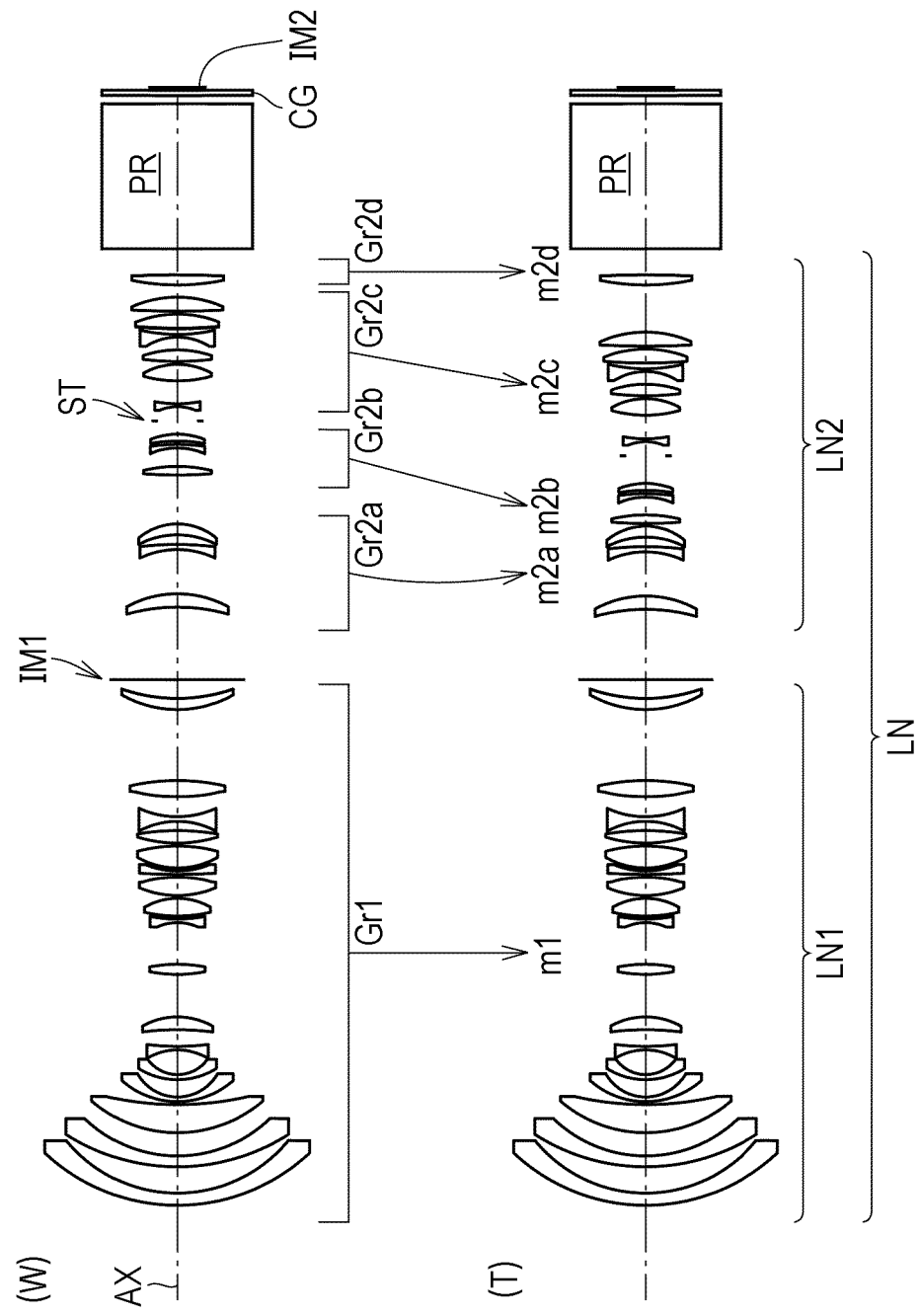
FIG. 12 is a view illustrating a configuration of a projection lens optical system of one or more embodiments.

The right side of FIG. 12 is a reduction side of the projection lens optical system LN, and the left side of FIG. 12 is an enlargement side of the projection lens optical system LN. A prism PR (for example, total internal reflection (TIR) prism, color separating-combining prism, and the like) and a cover glass CG covering an image display surface IM2 of the image display element are disposed on the reduction side of the projection lens optical system LN.

The projection lens optical system LN includes a first optical system LN1 and a second optical system LN2. The first optical system LN1 is disposed on the enlargement side with respect to an intermediate image plane IM1. The second optical system LN2 is disposed on the reduction side with respect to the intermediate image plane IM1. The second optical system LN2 forms an intermediate image of an image displayed on the image display surface IM2 of the image display element on the intermediate image plane IM1. The first optical system LN1 enlarges and projects the intermediate image. An aperture stop ST is disposed near the center of the second optical system LN2 in an optical axis AX direction.

FIG. 12 illustrates lens arrangement at a wide-angle end (W) and lens arrangement at a telephoto end (T) in the projection lens optical system LN. Arrows m1, m2a, m2b, m2c, and m2d in FIG. 12 indicate changes in positions of lenses in a first lens group Gr1 and a second-a to second-d lens groups Gr2a to Gr2d when switching is performed from the wide angle end (W) to the telephoto end (T). For example, the first lens group Gr1 and the second-d lens group Gr2d are fixed groups, and the second-a to second-c lens groups Gr2a to Gr2c are moving groups. Zooming is performed by moving each of the second-a to second-c lens groups Gr2a to Gr2c along the optical axis AX.

The projection lens optical system LN may include a plurality of the optical lenses 1 provided with the anti-reflection film according to one or more embodiments. For example, the projection lens optical system LN may include a first projection lens that is the optical lens 1 provided with the anti-reflection film, a second projection lens that is the optical lens 1 provided with the anti-reflection film, and a third projection lens that is the optical lens 1 provided with the anti-reflection film. A first refractive index of the lens substrate 10 of the first projection lens, a second refractive index of the lens substrate 10 of the second projection lens, and a third refractive index of the lens substrate 10 of the third projection lens satisfy a first expression, a second expression, and a third expression, respectively. The first expression, the second expression, and the third expression are three expressions selected from the following Expressions (1) to (6) and different from each other.

$$1.35 \leq n_s < 1.45 \quad \text{Expression (1)}$$

$$1.45 \leq n_s < 1.55 \quad \text{Expression (2)}$$

$$1.55 \leq n_s < 1.65 \quad \text{Expression (3)}$$

$$1.65 \leq n_s < 1.75 \quad \text{Expression (4)}$$

$$1.75 \leq n_s < 1.85 \quad \text{Expression (5)}$$

$$1.85 \leq n_s < 1.95 \quad \text{Expression (6)}$$

In addition to the first projection lens to the third projection lens, the projection lens optical system LN may further include a fourth projection lens that is the optical lens 1 provided with the anti-reflection film. A fourth refractive index of the lens substrate 10 of the fourth projection lens satisfies a fourth expression. The first expression, the second expression, the third expression, and the fourth expression are four expressions selected from the above Expressions (1) to (6) and different from each other.

In addition to the first projection lens to the fourth projection lens, the projection lens optical system LN may further include a fifth projection lens that is the optical lens 1 provided with the anti-reflection film. A fifth refractive index of the lens substrate 10 of the fifth projection lens satisfies a fifth expression. The first expression, the second expression, the third expression, the fourth expression, and the fifth expression are five expressions selected from the above Expressions (1) to (6) and different from each other.

In addition to the first projection lens to the fifth projection lens, the projection lens optical system LN may further include a sixth projection lens which is the optical lens 1 provided with the anti-reflection film. A sixth refractive index of the lens substrate 10 of the sixth projection lens satisfies a sixth expression. The first expression, the second expression, the third expression, the fourth expression, the fifth expression, and the sixth expression are six expressions selected from the above Expressions (1) to (6) and different from each other.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 Optical lens provided with an anti-reflection film
10 Lens substrate
20 Anti-reflection film
21 First layer
22 Second layer
23 Third layer
24 Fourth layer
25 Fifth layer
26 Sixth layer
27 Seventh layer
28 Eighth layer
29 Ninth layer
30 Tenth layer
31 Eleventh layer
32 Twelfth layer
33 Thirteenth layer
40 Ion-assisted deposition apparatus
41 Chamber
41a Exhaust port
41b Gas injection port
42 Exhaust pump
43 Gas supply unit
44 Substrate holder
45 First motor
46 Heater
47 Temperature sensor
48 Vapor deposition source
49 Electron gun
49e Electron
50 Film thickness meter
51 Ion source
52 Movable shutter
53 Second motor
55 Controller
AX Optical axis
CG Cover glass
Gr1 First lens group
Gr2a, Gr2d, Gr2c Lens group
IM1 Intermediate image plane
LN Projection lens optical system
LN1 First optical system
LN2 Second optical system
PR Prism

The invention claimed is:

1. A method for manufacturing an optical lens using an ion-assisted deposition apparatus that comprises an ion source, the method comprising:

forming, on a lens substrate made of a material containing 40 mass % or more of fluoride, a first lower layer of an anti-reflection film of the optical lens, wherein the first lower layer is a fluoride layer;

forming, on the first lower layer, a second lower layer of the anti-reflection film;

forming, on the second lower layer, one or more intermediate layers of the anti-reflection film;

forming, on the one or more intermediate layers, an uppermost layer of the anti-reflection film; and irradiating, using the ion source, the lens substrate with ions such that:

a first energy and a first amount per unit time of the ions reaching the first lower layer and at least a lower half of the second lower layer, while forming the first lower layer and at least the lower half of the second lower layer, are respectively smaller than a second energy and a second amount per unit time of the ions reaching the one or more intermediate layers while forming the one or more intermediate layers, and the lower half of the second lower layer is a portion of the second lower layer that is on a side of the first lower layer with respect to a center of the second lower layer in a thickness direction of the second lower layer.

2. The method according to claim 1, wherein a first ion acceleration voltage and a first ion current of the ion source, while forming the first lower layer and at least the lower half of the second lower layer, are respectively smaller than a second ion acceleration voltage and a second ion current of the ion source while forming the one or more intermediate layers.

3. The method according to claim 2, wherein
the first ion acceleration voltage is 300 volts (V) or less, and
the first ion current is 300 milliamperes (mA) or less.

4. The method according to claim 3, wherein
the second ion acceleration voltage is 500 V or more, and
the second ion current is 500 mA or more.

5. The method according to claim 3, wherein the first lower layer is a magnesium fluoride ($MgF_2$) layer.

6. The method according to claim 3, wherein
a ¼ wavelength optical thickness, of the first lower layer and at a design reference wavelength of 550 nanometers (nm), is 0.1 or more,
the ¼ wavelength optical thickness, of the first lower layer and at the design reference wavelength, is determined by dividing an optical thickness of the first lower layer by one fourth of the design reference wavelength, and
the optical thickness of the first lower layer is determined by a product of a refractive index of the first lower layer, at the design reference wavelength, and a physical thickness (nm) of the first lower layer.

7. The method according to claim 2, wherein
the second ion acceleration voltage is 500 V or more, and
the second ion current is 500 mA or more.

8. The method according to claim 2, wherein the first lower layer is a magnesium fluoride ($MgF_2$) layer.

9. The method according to claim 2, wherein
a ¼ wavelength optical thickness, of the first lower layer and at a design reference wavelength of 550 nanometers (nm), is 0.1 or more,
the ¼ wavelength optical thickness, of the first lower layer and at the design reference wavelength, is determined by dividing an optical thickness of the first lower layer by one fourth of the design reference wavelength, and
the optical thickness of the first lower layer is determined by a product of a refractive index of the first lower layer, at the design reference wavelength, and a physical thickness (nm) of the first lower layer.

10. The method according to claim 2, wherein
the uppermost layer is a fluoride layer, and
a third energy and a third amount per unit time of the ions reaching the uppermost layer, while forming the uppermost layer, are smaller than the second energy and the second amount per unit time, respectively.

11. The method according to claim 2, wherein the ions reaching an entirety of the second lower layer, while forming the entirety of the second lower layer, have the first energy and the first amount per unit time.

12. The method according to claim 2, wherein a fourth energy and a fourth amount per unit time of the ions reaching a portion of the second lower layer that is farthest from the lens substrate, when forming the portion of the second lower layer that is farthest from the lens substrate, are larger than the first energy and the first amount per unit time, respectively.

13. The method according to claim 1, wherein
the ion-assisted deposition apparatus further includes a movable shutter,
while forming the first lower layer and at least the lower half of the second lower layer, the movable shutter is positioned in a path of the ions from the ion source to the lens substrate, and
while forming the one or more intermediate layers, the movable shutter is not positioned in the path of the ions.

14. The method according to claim 1, wherein the first lower layer is a magnesium fluoride ($MgF_2$) layer.

15. The method according to claim 1, wherein
a ¼ wavelength optical thickness, of the first lower layer and at a design reference wavelength of 550 nanometers (nm), is 0.1 or more,
the ¼ wavelength optical thickness, of the first lower layer and at the design reference wavelength, is determined by dividing an optical thickness of the first lower layer by one fourth of the design reference wavelength, and
the optical thickness of the first lower layer is determined by a product of a refractive index of the first lower layer, at the design reference wavelength, and a physical thickness (nm) of the first lower layer.

16. The method according to claim 1, wherein
the uppermost layer is a fluoride layer, and
a third energy and a third amount per unit time of the ions reaching the uppermost layer, while forming the uppermost layer, are smaller than the second energy and the second amount per unit time, respectively.

17. The method according to claim 16, wherein the uppermost layer is an $MgF_2$ layer.

18. The method according to claim 1, wherein the ions reaching an entirety of the second lower layer, while forming the entirety of the second lower layer, have the first energy and the first amount per unit time.

19. The method according to claim 1, wherein a fourth energy and a fourth amount per unit time of the ions reaching a portion of the second lower layer that is farthest from the lens substrate, when forming the portion of the second lower layer that is farthest from the lens substrate, are larger than the first energy and the first amount per unit time, respectively.

20. The method according to claim 19, wherein the fourth energy and the fourth amount per unit time are equal to the second energy and the second amount per unit time, respectively.

* * * * *